United States Patent
O'Brien et al.

(10) Patent No.: US 9,772,556 B2
(45) Date of Patent: Sep. 26, 2017

(54) PULSED LIGHT BEAM SPECTRAL FEATURE CONTROL

(71) Applicant: Cymer, LLC, San Diego, CA (US)

(72) Inventors: Kevin M. O'Brien, San Diego, CA (US); Rahul Ahlawat, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 15/435,491

(22) Filed: Feb. 17, 2017

(65) Prior Publication Data

US 2017/0160638 A1    Jun. 8, 2017

Related U.S. Application Data

(63) Continuation of application No. 14/794,508, filed on Jul. 8, 2015.

(Continued)

(51) Int. Cl.
  *G03F 7/20* (2006.01)
  *G01J 3/12* (2006.01)
  (Continued)

(52) U.S. Cl.
  CPC ............. *G03F 7/2006* (2013.01); *G01J 3/12* (2013.01); *G02B 26/007* (2013.01); *G03F 7/70* (2013.01); *H01S 3/104* (2013.01); *H01S 3/11* (2013.01)

(58) Field of Classification Search
  CPC .. G03F 7/70; G03F 7/2006; G01J 3/12; G01J 2003/1282; H01S 3/104; H01S 3/11
  See application file for complete search history.

(56) References Cited

U.S. PATENT DOCUMENTS 6,539,046 B2   3/2003   Newman et al.
6,567,450 B2   5/2003   Myers et al.
(Continued)

FOREIGN PATENT DOCUMENTS

TW    201434563 A1    9/2014
WO    01/48881 A1     7/2001
WO    2008/127599 A2  10/2008

OTHER PUBLICATIONS

Gratiet et al., "Improved CD control for 45/40nm CMOS logic patterning. Anticipation for 32/28nm," Proc. SPIE 7638, Metrology, Inspection, and Process Control for Microlithography XXIV, 76380A (Apr. 1, 2010), accessible from http://www.meditec.zeiss.com/C1256C 15004B31 FF/EmbedTitelIntern/SPIE201 OAbstractSTWLCD/$File/SPIE2010_ST_Crolles_paper.pdf, 11 pages.

(Continued)

*Primary Examiner* — Eric Bolda
(74) *Attorney, Agent, or Firm* — DiBerardino McGovern IP Group LLC

(57) ABSTRACT

A system includes a first actuatable apparatus of an optical source, the first actuatable apparatus being altered within a range of values about a target value to thereby alter a spectral feature of the light beam; a second actuatable apparatus of the optical source, the second actuatable apparatus being altered to thereby alter the spectral feature of the light beam; a metrology system including an observation system configured to output an indication of a deviation between the actual value at which the first actuatable apparatus is operating and the target value; and a control system configured to determine whether the deviation is greater than an acceptable deviation, and, if it is greater than the acceptable deviation, then send a signal to a second actuation module controlling the second actuatable apparatus to adjust the actual value at which the first actuatable apparatus is operating to be closer to the target value.

20 Claims, 8 Drawing Sheets

Related U.S. Application Data

(60) Provisional application No. 62/185,452, filed on Jun. 26, 2015.

(51) Int. Cl.

| | | |
|---|---|---|
| *H01S 3/10* | | (2006.01) |
| *H01S 3/11* | | (2006.01) |
| *G02B 26/00* | | (2006.01) |
| *H01S 3/104* | | (2006.01) |

(56) References Cited

U.S. PATENT DOCUMENTS

| | | |
|---|---|---|
| 6,614,828 B1 | 9/2003 | Basting et al. |
| 6,650,666 B2 | 11/2003 | Spangler et al. |
| 6,785,306 B2 | 8/2004 | Kai et al. |
| 6,795,188 B2 | 9/2004 | Ruck et al. |
| 6,985,508 B2 | 1/2006 | Knowles et al. |
| 7,057,705 B2 | 6/2006 | Heintze |
| 7,085,302 B2 | 8/2006 | Nagai |
| 7,154,928 B2 | 12/2006 | Sandstrom et al. |
| 7,203,216 B2 | 4/2007 | Ershov et al. |
| 7,304,748 B2 | 12/2007 | Rafac |
| 7,822,084 B2 | 10/2010 | O'Brien et al. |
| 7,830,934 B2 | 11/2010 | Jacques |
| 7,852,889 B2 | 12/2010 | Dunstan et al. |
| 8,144,739 B2 | 3/2012 | Figueroa et al. |
| 8,254,420 B2 | 8/2012 | Riggs et al. |
| 8,520,186 B2 | 8/2013 | Seong et al. |
| 2001/0019562 A1 | 9/2001 | Kai et al. |
| 2002/0154668 A1 | 10/2002 | Knowles et al. |
| 2003/0031216 A1 | 2/2003 | Fallon et al. |
| 2005/0271100 A1 | 12/2005 | Everett et al. |
| 2006/0114956 A1 | 6/2006 | Sandstrom et al. |
| 2006/0114957 A1 | 6/2006 | Algots et al. |
| 2007/0297467 A1 | 12/2007 | Fomenkov et al. |
| 2008/0253408 A1 | 10/2008 | Ishihara |
| 2008/0253413 A1 | 10/2008 | Partlo |
| 2008/0285602 A1 | 11/2008 | Nagai et al. |
| 2011/0249691 A1 | 10/2011 | O'Brien et al. |
| 2014/0076863 A1 | 3/2014 | Moffitt |
| 2014/0197140 A1 | 7/2014 | Unrath |
| 2015/0268176 A1 | 9/2015 | Deng et al. |
| 2016/0380402 A1 | 12/2016 | O'Brien et al. |

OTHER PUBLICATIONS

Myers et al., "Production-Ready 2kHz KrF Excimer Laser for DUV Lithography," Optical Microlithography XII, Proc. of SPIE vol. 3679, 1999, 12 pages.

Kroyan et al., "Effects of 95% Integral vs. FWHM Bandwidth Specifications on Lithographic Imaging," Optical Microlithography XIV, Proc. of SPIE vol. 4346, 2001, 10 pages.

Planchot et al., "Full field lithographical verification using scanner and mask intrafield fingerprint," Optical Microlithography XXV, Proc. of SPIE vol. 8326, 2012, 9 pages.

Maas, "Improve your CDU in one month," accessible at http://www.asml.com/doclib/productandservices/ images/2009/Spring/Articles/Images_Spring_Edit_2009%2018-19.pdf, ASML Images, Spring Edition, 2009, 2 pages.

Mulkens et al., "Holistic optimization architecture enabling sub-14-nm projection lithography," Journal of Micro/Nanolithography, MEMS, and MOEMS 13(1), 011006, Jan.-Mar. 2014, 11 pages, downloaded from http://spiedigitallibrary.org/ on Apr. 17, 2014.

Sengupta, "Krypton fluoride excimer laser for advanced microlithography," Optical Engineering 32(10), 2410-2420 (Oct. 1993), 11 pages.

Rafac, "Overcoming limitations of etalon spectrometers used for spectral metrology of DUV excimer light sources," Optical Microlithography XVII, Proc. of SPIE vol. 5377, 2004, 13 pages.

Le Gratiet et al., "Intrafield Process Control for 45 nm CMOS logic patterning," Proc. of SPIE vol. 7272, 2009, 10 pages.

Le-Gratiet et al., "Integration and Automation of DoseMapperTM in a logic lab APC system. Application for 45/40/28nm node," Proc. of SPIE vol. 8324, 2012, 10 pages.

Flagello, "Evolution of Optical Lithography towards 22nm and beyond," Approaching the Optical Limit: Workshop on Optical Lithography at 22nm and 16nm, May 15, 2008, Bolton Landing, NY, accessible from http://sematech.org/meetings/archives/litho/8373/index.htm, 39 pages.

Benschop et al., "Integrated scatterometry for tight overlay and CD control to enable 20-nm node wafer manufacturing," Proc. of SPIE vol. 8683, 2013, 8 pages.

Dunstan et al., "Active Spectral Control of DUV light sources for OPE minimization," Optical Microlithography XIX, Proc. of SPIE vol. 6154, 2006, 9 pages.

Shane Thomas, U.S. International Searching Authority, International Search Report and Written Opinion, counterpart PCT Application No. PCT/US2016/037435, mailed Oct. 28, 2016, 25 pages total.

Brunner et al., "Laser Bandwidth and Other Sources of Focus Blur in Lithography," Journal of Micro/Nanolithography, MEMS, and MOEMS vol. 5, Issue 4, Oct. 2006, 8 pages.

Jacques et al., "Active Spectral-Control Techniques for Improving OPC," Solid State Technology, PennWell Corporation, copyright 2009, captured Aug. 25, 2009 from http://www.solid-state.com/display_article/279735/5/none/none/Feat/Active-spectral-control-techniquesfor-improving-OPC, 4 pages.

Office Action and Search Report, counterpart Taiwanese Patent Application No. 105117663, mailed Apr. 19, 2017, 6 pages total (including English translation of 3 pages).

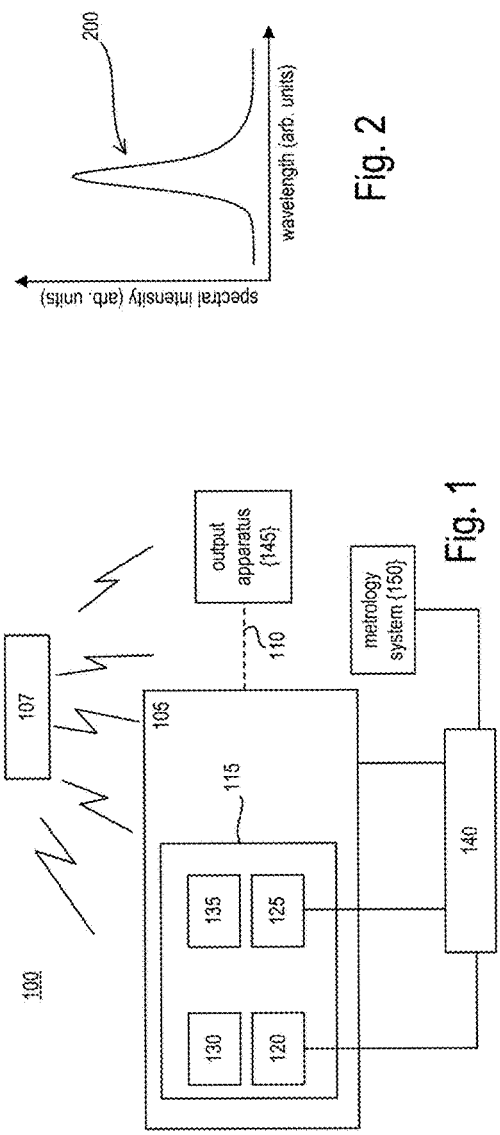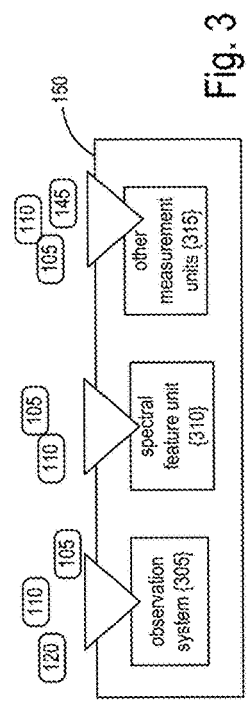

PULSED LIGHT BEAM SPECTRAL FEATURE CONTROL

CROSS REFERENCE TO RELATED APPLICATIONS

This application is a continuation of U.S. application Ser. No. 14/794,508, filed Jul. 8, 2015, now allowed, and titled "Pulsed Light Beam Spectral Feature Control," which claims the benefit of U.S. Application No. 62/185,452, filed Jun. 26, 2015, and titled "Pulsed Light Beam Spectral Feature Control." Both applications are incorporated herein by reference in their entirety.

TECHNICAL FIELD

The disclosed subject matter relates to controlling a spectral feature of a pulsed light beam produced by an optical source.

BACKGROUND

An accurate knowledge of spectral features or properties (for example, a bandwidth) of a light beam output from an optical source such as a laser is important in many scientific and industrial applications. For example, accurate knowledge of the optical source bandwidth is used to enable control of a minimum feature size or critical dimension (CD) in deep ultraviolet (DUV) optical lithography. The critical dimension is the feature size that is printed on a semiconductor substrate (also referred to as a wafer) and therefore the CD can require fine size control. In optical lithography, the substrate is irradiated by a light beam produced by an optical source. Often, the optical source is a laser source and the light beam is a laser beam.

SUMMARY

In some general aspects, a system controls a spectral feature of a pulsed light beam produced by an optical source. The system includes a first actuation module coupled to a first actuatable apparatus of the optical source, the first actuatable apparatus being altered within a range of values by the first actuation module to thereby adjust the spectral feature of the pulsed light beam; a second actuation module coupled to a second actuatable apparatus of the optical source, the second actuatable apparatus being altered by the second actuation module to thereby adjust the spectral feature of the pulsed light beam; and a control system connected to the first actuation module and the second actuation module. The control system is configured to: receive an indication regarding the operating state of the first actuatable apparatus; and send a signal to the second actuation module to adjust the spectral feature of the pulsed light beam to either: prevent the first actuatable apparatus from saturating based on the received indication of the operating state of the first actuatable apparatus, or desaturate the first actuatable apparatus if the received indication of the operating state of the first actuatable apparatus indicates that it is saturated.

Implementations can include one or more of the following features. For example, the optical source can include a gas discharge system having a chamber that houses a gain medium that produces a pulsed light beam when pumped with current pulses in an electric discharge.

The control system can be configured to: receive a measurement of the spectral feature of the pulsed light beam output from the optical source; and send a signal to one or more of the first actuation module and the second actuation module to adjust the spectral feature of the pulsed light beam to a new value based on the received measurement of the spectral feature of the pulsed light beam.

The optical source can be a multi-stage gas discharge system, with the first stage being an oscillator apparatus that outputs a pulsed seed light beam and the second stage being an optical amplification apparatus that receives the pulsed seed light beam and outputs the pulsed light beam, and both stages include a gas discharge sub-system. The first actuation module can be a timing module that is connected to the first stage and the second stage to control a relative timing between a first trigger signal sent to the first stage and a second trigger signal sent to the second stage.

The second actuation module can be a spectral selection module interacting with the pulsed light beam. The spectral selection module can include an optical system that is configured to adjust an optical magnification of the pulsed light beam. The optical system can be coupled to a first stage of the optical source. The spectral feature of the pulsed light beam can be a width of the pulsed light beam.

The system can also include a third actuation module coupled to a third actuatable apparatus of the optical source, the third actuatable apparatus being altered by the third actuation module to thereby alter another spectral feature of the pulsed light beam.

The system can include a metrology system including an observation system connected to the first actuation module and configured to output the indication regarding the operating state of the first actuatable apparatus. The metrology system can include a spectral feature unit configured to measure a spectral feature of the pulsed light beam output from the optical source, and the control system can be configured to receive the measurement of the spectral feature of the pulsed light beam. The metrology system can be separate from the first actuation module and the control system. The metrology system can be configured to receive a characteristic of the pulsed light beam.

In other general aspects, a method for controlling an optical source includes receiving an indication of an operating point of a first actuatable apparatus of the optical source, the operating point of the first actuatable apparatus being alterable between a lower limit and an upper limit to thereby adjust a spectral feature of a pulsed light beam produced by the optical source, and the first actuatable apparatus being in a saturated state when the operating point is at the lower limit or the upper limit and being in an unsaturated state when the operating point is between the upper limit and the lower limit. The method includes determining a location of the operating point of the first actuatable apparatus between the upper limit and the lower limit based on the indication of the operating point of the first actuatable apparatus of the optical source; determining whether the first actuatable apparatus is in the saturated state based on the determined location; and, if the first actuatable apparatus is determined to be in the saturated state, altering a second, distinct actuatable apparatus of the optical source to change the first actuatable apparatus to the unsaturated state and to adjust the spectral feature of the pulsed light beam.

Implementations can include one or more of the following features. For example, determining a location of the operating point of the first actuatable apparatus between the lower limit and the upper limit can include determining the location of the operating point relative to one or more of an upper activation limit and a lower activation limit, the upper activation limit and the lower activation limit being between the upper limit and the lower limit. Determining whether the first actuatable apparatus is in the saturated state based on the determined location can include determining whether the operating point is between the upper activation limit and the upper limit or between the lower activation limit and the lower limit. The unsaturated state of the first actuatable apparatus can be between the upper activation limit and the lower activation limit. If the first actuatable apparatus is in the saturated state, then the method can include continuing to alter the second, distinct apparatus until the operating point of the first actuatable apparatus is between an upper deactivation limit and a lower deactivation limit, the upper and lower deactivation limits being between the upper and lower activation limits. The first actuatable apparatus can be associated with a target operating point that is between the upper and lower deactivation limits.

The method second, distinct actuatable apparatus can include an optical element configured to interact with the pulsed light beam emitted from the optical source. The second, distinct actuatable apparatus can be altered only when the optical element is not interacting with the pulsed light beam. The second, distinct actuatable apparatus can be altered by moving the optical element relative to a path of the pulsed light beam.

The first actuatable apparatus can be associated with a target operating point that is between the upper limit and the lower limit, and a location of the operating point of the first actuatable apparatus can be determined by comparing the indication of the operating point to the target operating point. The second, distinct actuatable apparatus can be altered to change the first actuatable apparatus to the unsaturated state by adjusting the operating point of the first actuatable apparatus to be closer to the target operating point. The second, distinct actuatable apparatus can be altered to change the first actuatable apparatus to the unsaturated state by adjusting the operating point of the first actuatable apparatus to be between a deactivation limit and the target operating point, the deactivation limit being between the target operating point and one of the upper limit and the lower limit. The second, distinct actuatable apparatus can be altered to change the first actuatable apparatus to the unsaturated state by adjusting the operating point of the first actuatable apparatus to be equal to the target operating point.

The upper limit and the lower limit of the first actuatable apparatus can be equidistant from the target operating point of the first actuatable apparatus.

The upper limit and the lower limit of the first actuatable apparatus can be not equidistant from the target operating point of the first actuatable apparatus.

The second, distinct actuatable apparatus can be altered such that the operating point of the first actuatable apparatus is adjusted to a deactivation point, the deactivation point being between the target operating point and one of the upper limit and the lower limit.

The spectral feature can be a spectral bandwidth of the pulsed light beam.

If the first actuatable apparatus is in the saturated state, then the method can include altering a third, distinct actuatable apparatus of the optical source to adjust a second spectral feature of the pulsed light beam, the second spectral feature being different than the spectral feature. The spectral feature can include a spectral bandwidth and the second spectral feature can include a wavelength. The adjustment to the spectral bandwidth caused by altering the second actuatable apparatus can change the wavelength of the pulsed light beam, and the alteration to the third actuatable apparatus can compensate for the change in wavelength.

One or more of the upper limit of the first actuatable apparatus and the lower limit of the first actuatable apparatus can include a range of numerical values.

The target operating point can be adjustable during use of the optical system.

The method can include receiving an estimation of the spectral feature of the pulsed light beam produced by the optical source; determining whether the spectral feature estimation is outside a range of target values of the spectral feature; and, if the spectral feature estimation is outside the range of target values of the spectral feature, altering the first actuatable apparatus to adjust the spectral feature of the pulsed light beam.

In other general aspects, a system for controlling a spectral feature of a pulsed light beam produced by an optical source includes a first actuation module, a second actuation module, a metrology system, and a control system. The first actuation module is coupled to a first actuatable apparatus of the optical source, the first actuatable apparatus being altered within a range of values about a target value by the first actuation module to thereby alter the spectral feature of the pulsed light beam. The second actuation module is coupled to a second and distinct actuatable apparatus of the optical source, the second actuatable apparatus being altered by the second actuation module to thereby alter the spectral feature of the pulsed light beam. The metrology system includes an observation system connected to at least the first actuation module and configured to output a metric that indicates a deviation between the actual value at which the first actuatable apparatus is operating and the target value. The control system is connected to the first actuation module, the second actuation module, and the metrology system, and is configured to: determine whether the deviation is greater than an acceptable deviation, and if the deviation is outside the acceptable deviation, then send a signal to the second actuation module to adjust the spectral feature of the pulsed light beam to thereby adjust the actual value at which the first actuatable apparatus is operating to be closer to the target value.

Implementations can include one or more of the following features. For example, the optical source can include a gas discharge system having at least one chamber that houses a gain medium that produces a pulsed light beam when pumped with current pulses in an electric discharge.

The metrology system can include a spectral feature unit configured to measure the spectral feature of the pulsed light beam output from the optical source, and the control system is configured to receive the measurement of the spectral feature of the pulsed light beam. The control system can be configured to send a signal to one or more of the first actuation module and the second actuation module to adjust the spectral feature of the pulsed light beam to a new value based on the received measurement of the spectral feature from the spectral feature unit.

The control system can determine whether the deviation is greater than the acceptable deviation by determining whether the deviation is so great that the first actuation module is unable to alter the spectral feature of the pulsed light beam to a new value.

The optical source can be a multi-stage gas discharge system, with the first stage being an oscillator apparatus that outputs a pulsed seed light beam and the second stage being an optical amplification apparatus that receives the pulsed seed light beam and outputs the pulsed light beam, and both stages include a gas discharge sub-system. The first actuation module can be a timing module that is connected to the first stage and the second stage to control a relative timing between a first trigger signal sent to the first stage and a second trigger signal sent to the second stage.

The second actuation module can be a spectral selection module interacting with the pulsed light beam. The spectral selection module can include an optical system that is configured to adjust an optical magnification of the pulsed light beam. The optical system can be coupled to a first stage of the optical source. The spectral feature of the pulsed light beam can be a width of the pulsed light beam.

The system can include a third actuation module coupled to a third actuatable apparatus of the optical source, the third actuatable apparatus being altered by the third actuation module to thereby alter another spectral feature of the pulsed light beam.

In other general aspects, a system includes an optical source configured to emit a pulsed output light beam, an actuatable apparatus, and a control system. The optical source includes a first chamber and a second chamber positioned on a beam path, the first chamber providing a pulsed seed light beam to the second chamber, the second chamber configured to receive the pulsed seed light beam and emit the pulsed output light beam, and a spectral selection module comprising at least one actuatable optical element positioned on the beam path. The actuatable apparatus is coupled to the first chamber of the optical source and the second chamber of the optical source. The actuatable apparatus has an adjustable operating point and is associated with a target operating point, the actuatable apparatus being in a saturated state when the adjustable operating point is at an upper limit or a lower limit and being in an unsaturated state when the adjustable operating point is between the upper limit and the lower limit. The control system is coupled to the optical source and the actuatable apparatus. The control system is configured to: access an indication of a value of the adjustable operating point of the actuatable apparatus, compare the accessed indication of the value of the adjustable operating point to the upper limit and the lower limit, determine if the actuatable apparatus is in a saturated state based on the comparison, and, if the actuatable apparatus is in the saturated state, actuate at least one of the at least one optical elements of the spectral selection module to change the actuatable apparatus to the unsaturated state.

DESCRIPTION OF DRAWINGS

FIG. 1 is a block diagram of an optical system including an actuation system for controlling a pulsed light beam directed to an output apparatus;

FIG. 2 is a graph of an exemplary optical spectrum of the pulsed light beam;

FIG. 3 is a block diagram of an exemplary metrology system that can be used in the optical system of FIG. 1;

DESCRIPTION

Figure 7:
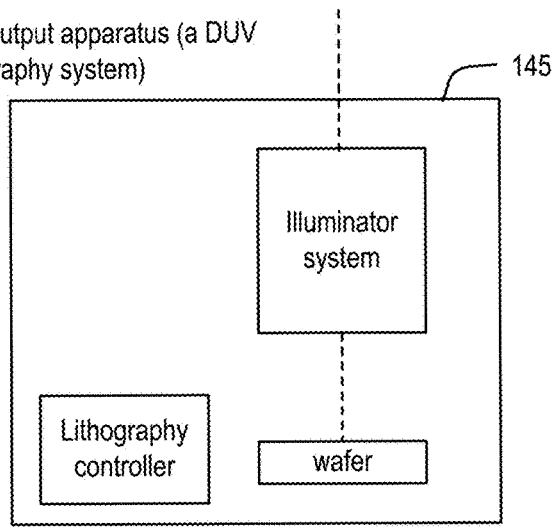
FIG. 7 is a block diagram of an exemplary output apparatus that is a photolithography system.

Referring to FIG. 1, an optical system 100 includes an optical source 105 that produces a pulsed light beam 110 that is directed to an output apparatus 145 (such as a lithography exposure apparatus that patterns microelectronic features on a wafer, as shown in FIG. 7). While not shown, the light beam 110 may also be directed through a beam preparation system placed between the optical source and the output apparatus 145, the beam preparation system can include optical elements that modify aspects of the light beam 110. For example, the beam preparation system can include reflective or refractive optical elements, optical pulse stretchers, and optical apertures (including automated shutters).

If the output apparatus is a photolithography system, then it uses a light beam 110 having a wavelength in the deep ultraviolet (DUV) range, for example, with wavelengths of 248 nanometers (nm) or 193 nm. The size of the microelectronic features patterned on the wafer depends on the wavelength of the light beam 110, with a lower wavelength enabling a smaller minimum size. When the wavelength of the light beam 110 is 248 nm or 193 nm, the minimum size of the microelectronic features can be, for example, 50 nm or less.

Referring to FIG. 2, the optical spectrum 200 (or emission spectrum) of a pulsed light beam 110 produced by the optical source 105 contains information on how the optical energy or power is distributed over different wavelengths. The optical spectrum 200 of the light beam 110 is depicted in the form of a diagram where the spectral intensity (not necessarily with an absolute calibration) is plotted as a function of the wavelength or optical frequency. The optical spectrum 200 can be referred to as the spectral shape or intensity spectrum of the light beam 110. Spectral properties or features of the light beam 110 include any aspect or representation of the intensity spectrum. For example, bandwidth and wavelength are spectral features of the light beam 110. The bandwidth of the light beam 110 is a measure of the width of this spectral shape, and this width can be given in terms of wavelength or frequency of the laser light. Any suitable mathematical construction (that is, metric) related to the details of the optical spectrum 200 can be used to estimate a value that characterizes the bandwidth of the light beam. For example, the full width of the spectrum at a fraction (X) of the maximum peak intensity of the spectral shape (referred to as FWXM) can be used to characterize the light beam bandwidth. As another example, the width of the spectrum that contains a fraction (Y) of the integrated spectral intensity (referred to as EY) can be used to characterize the light beam bandwidth.

During operation of the optical source, various disturbances 107 (such as temperature gradients, pressure gradients, optical distortions, change in operating conditions, etc.) act on the optical source 105 and the light beam 110 to modify the spectral features of the light beam 110. Because of the disturbances 107, the actual spectral feature (such as the bandwidth or the wavelength) of the light beam 110 at the output apparatus may not correspond to or match with the spectral feature that is desired at the output apparatus 145. Thus, the actual spectral feature (such as a characteristic bandwidth) of light beam 110 is measured or estimated during operation by estimating a value of a metric from the optical spectrum. An operator or an automated system (for example, a feedback controller) can use the measured or estimated bandwidth to adjust the properties of the optical source 105 and to adjust the optical spectrum of the light beam 110 using an actuation system 115.

Thus, the optical system 100 includes the actuation system 115, which includes two or more actuation modules (such as first and second actuation modules 120, 125) that are coupled to respective two or more actuatable apparatus (such as respective first and second actuatable apparatus 130, 135) of the optical source 105 and are controlled by a control system 140. The first actuatable apparatus 130 is altered by the first actuation module 120 (under the control of the control system 140) to adjust the spectral feature of the pulsed light beam 110 and the second actuatable apparatus 135 is altered by the second actuation module 125 (under the control of the control system 140) to adjust the spectral feature of the pulsed light beam 110. In this way, the effect of these disturbances 107 on the light beam 110 can be corrected.

It is possible and sometimes necessary to configure the optical system 100 so that the first actuatable apparatus 130 is able to act more quickly and/or within a more fine tuning range than the second actuatable apparatus 135 to effect the adjustment to the spectral feature of the light beam 110.

If the first actuatable apparatus 130 becomes saturated, which means that it is not able to adjust the spectral feature of the light beam 110 even though it is being altered under control of the first actuation module 120, then the effect of the disturbances 107 will not be fully or adequately corrected and the spectral feature at the output apparatus will not be adequately corrected or adjusted. The optical system 100 includes a metrology system 150, which can include one or more sub-systems for observing or measuring characteristics of the optical system 100. The control system 140 and the metrology system 150 work in combination to, among other things, determine whether the first actuatable apparatus 130 is in a saturated state and, if the first actuatable apparatus 130 is in a saturated state, desaturate the first actuatable apparatus 130 during operation of the optical system 100 (for example, while the optical system 100 is producing the light beam 110 that is directed to the output apparatus 145 or in between bursts or pulses of the light beam 110 during operation of the optical source 105) without having to shut down the optical source 105. After being desaturated, the first actuatable apparatus 130 is able to adjust the spectral feature of the light beam 110. The first actuatable apparatus 130 is considered to be in a saturated state when the first actuatable apparatus 130 is saturated, which means that it is not able to adjust the spectral feature of the light beam 110 as discussed above, or when the first actuatable apparatus 130 nears saturation. Examples of determining whether the first actuatable apparatus 130 is in a saturated state are discussed below, for example, with respect to FIGS. 8 and 9.

The control system 140 and the metrology system 150 can alternatively or additionally work in combination to, among other things, continuously determine whether the first actuatable apparatus 130 is in a saturated state and, if the first actuatable apparatus 130 is in a saturated state, adjust an aspect of the optical source 105 (such as the first actuation module 120) to continuously reposition or reset the first actuatable apparatus 130 (for example, by adjusting an operating state or point of the first actuatable apparatus 130) so that it does not become saturated.

Referring also to FIG. 3, the metrology system 150 includes an observation system 305 that is configured to observe characteristics associated with the first actuation module 120. The observation system 305 can be configured to observe characteristics associated with one or more other components of the optical system 100 such as the optical source 105 and the output apparatus 145, as discussed in more detail below. The observation system 305 is configured to output a metric (which is received by the control system 140) that indicates a deviation between an actual value at which the first actuatable apparatus 130 is operating and a target value. This metric indicates whether the first actuatable apparatus 130 is capable of being altered within a range of values about the target value. In general, the first actuatable apparatus 130 can be altered within a range of values about the target value by the first actuation module 120. This target value is selected to enable the first actuatable apparatus 130 to remain in a position at which it can be adjusted about its range to adjust the spectral feature of the light beam 110.

As shown in FIG. 3, the metrology system 150 also includes a spectral feature unit 310 that is configured to measure a spectral feature of the pulsed light beam 110 output from the optical source 105.

The control system 140 is connected to the first actuation module 120, the second actuation module 125, and the metrology system 150. A connection between the control system 140 and a specific component (such as the metrology system 150) can be a wired connection or can be a wireless and non-contact connection.

The control system 140 is configured to determine whether the deviation indicated by the metric determined by the observation system 305 is greater than an acceptable deviation. If the deviation is outside the acceptable deviation, then the control system 140 sends a signal to the second actuation module 125 to adjust the spectral feature of the pulsed light beam 110. The adjustment of the spectral feature of the pulsed light beam 110 by the second actuation module 125 causes an adjustment in the actual value at which the first actuatable apparatus 130 is operating to be closer to the target value.

Additionally, the control system 140 is configured to determine whether the measure of the spectral feature from the spectral feature unit 310 is close enough to a desired or reference value of the spectral feature. If the measured spectral feature is not close enough to a reference value, then the control system 140 could send a signal to one or more of the first actuation module 120 and the second actuation module 125 to adjust the spectral feature to a new value that is closer to the reference value. In some implementations, the control system 140 sends a signal to the first actuation module 120 to effect the adjustment or change in the spectral feature. In this way, the spectral feature (for example, the bandwidth) is under closed-loop control using the first actuation module 120.

As discussed above, the adjustment of the spectral feature of the pulsed light beam 110 using the second actuation module 125 causes an adjustment in the actual value at which the first actuatable apparatus 130 is operating to be closer to the target value. This happens because the spectral feature is adjusted with the second actuation module 125, and the associated adjustment of the spectral feature impacts the value of the spectral feature that is measured at the spectral feature unit 310. This, in turn, causes the control system 140 to send a signal to the first actuation module 120 to adjust the spectral feature, and in so doing, the actual value at which the first actuatable apparatus 130 is operating moves closer to the target value. To put it another way, both the first actuatable apparatus 130 and the second actuatable apparatus 135 are in series with each other, which means that when the value or setting of one is changed, then the value or setting of the second one is changed and both act to change the spectral feature. Thus, it is possible to control the range or value of one using adjustments of the second (as discussed above and also below).

In this way, saturation of the first actuatable apparatus 130 is avoided by continuously adjusting the actual value at which the first actuatable apparatus 130 is operating to be closer to the target value and/or by adjusting a range of possible values in which the first actuatable apparatus 130 is configured to operate to be farther away from a saturation regime, thus reducing the chances of a saturation event. Saturation of the first actuatable apparatus 130 can occur during normal usage of the optical system 100. When saturation of the first actuatable apparatus 130 occurs, then the optical system 100 is unable to provide for adequately fast or fine control of the spectral feature of the light beam 110, and this leads to destabilization of the spectral feature and degrades the performance of the output apparatus.

In addition to controlling the spectral feature (such as the bandwidth), another spectral feature (such as the wavelength) can be controlled for example, by way of a closed-loop control with the second actuation module 125.

Figure 4:
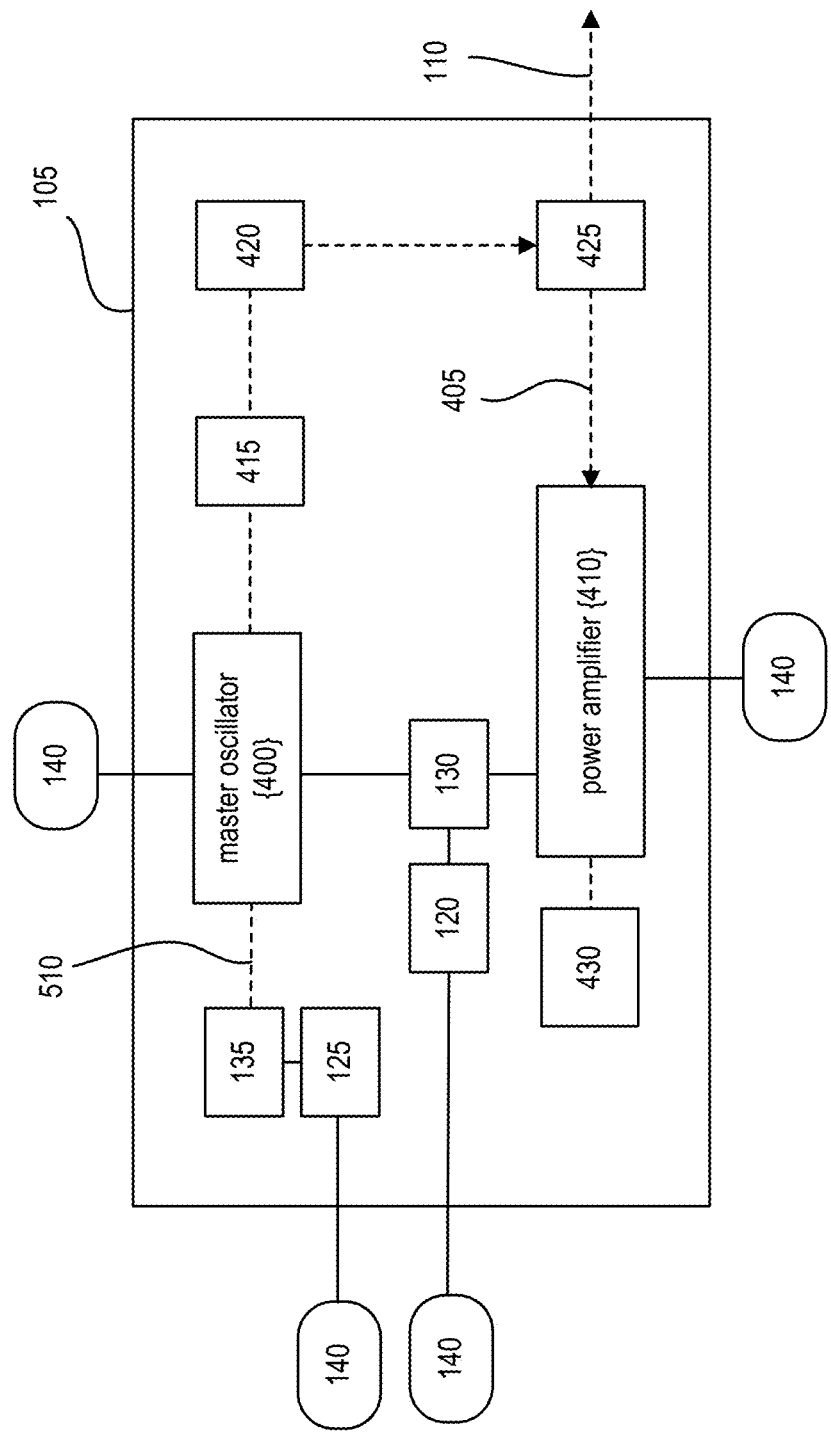
FIG. 4 is a block diagram of an exemplary optical source that can be used in the optical system of FIG. 1.

Referring to FIG. 4, an exemplary optical source 105 is a pulsed laser source that produces a pulsed laser beam as the light beam 110. As shown in the example of FIG. 4, the optical source 105 is a multi-stage (for example, two-stage) laser system that includes a master oscillator (MO) 400 that provides a seed light beam 405 to a power amplifier (PA) 410. The master oscillator 400 typically includes a gain medium in which amplification occurs and an optical feedback mechanism such as an optical resonator. The power amplifier 410 typically includes a gain medium in which amplification occurs when seeded with the seed laser beam from the master oscillator 400. If the power amplifier 410 is designed as a regenerative ring resonator then it is described as a power ring amplifier (PRA), and in this case, enough optical feedback can be provided from the ring design. The master oscillator 400 enables fine tuning of spectral parameters such as the center wavelength and the bandwidth at relatively low output pulse energies (when compared with the output of the power amplifier 410). The power amplifier 410 receives the output (the seed light beam 405) from the master oscillator 400 and amplifies this output to attain the necessary powers for output to use in the output apparatus 145 (for example, for photolithography).

The master oscillator 400 includes a discharge chamber having two elongated electrodes, a laser gas that serves as the gain medium, a fan for circulating the gas between the electrodes. A laser resonator is formed between the second actuatable apparatus 135 (which acts as a spectral feature selection system) on one side of the discharge chamber and an output coupler 415 on a second side of the discharge chamber. The optical source 105 can also include a line center analysis module (LAM) 420 that receives an output from the output coupler 415 and provides one of the other measurements units 315 of the metrology system 150 shown in FIGS. 1 and 3. The optical source 105 can also include one or more beam modification optical systems 425 that modify the size and/or shape of the seed light beam 405 or the pulsed light beam 110 as needed.

The line center analysis module 420 is an example of one type of measurement unit 315 that can be used to measure the wavelength (for example, the center wavelength) of the seed light beam 405 or the pulsed light beam 110.

The laser gas used in the discharge chamber can be any suitable gas for producing a laser beam around the required wavelengths and bandwidth, for example, the laser gas can be argon fluoride (ArF), which emits light at a wavelength of about 193 nm, or krypton fluoride (KrF), which emits light at a wavelength of about 248 nm.

The power amplifier 410 includes a power amplifier discharge chamber, and, if it is a regenerative ring amplifier, the power amplifier also includes a beam return (such as a reflector) 430 that returns (via reflection, for example) the light beam back into the discharge chamber to form a circulating and looped path (in which the input into the ring amplifier intersects the output out of the ring amplifier). The power amplifier discharge chamber includes a pair of elongated electrodes, a laser gas that serves as the gain medium, and a fan for circulating the gas between the electrodes. The seed light beam 405 is amplified by repeatedly passing through the power amplifier 410. Spectral features of the seed light beam 405 are determined by the configuration of the master oscillator 400, and these spectral features can be adjusted by adjusting a light beam 510 that is produced within the master oscillator 400. The beam modification optical system 425 provides a way (for example, a partially-reflecting mirror) to in-couple the seed light beam 405 and to out-couple a portion of the amplified radiation from the power amplifier 410 to form the output light beam 110.

The line center analysis module 420 monitors the wavelength of the output of the master oscillator 400. The line center analysis module 420 can be placed at other locations within the optical source 105, or it can be placed at the output of the optical source 105.

Figure 5:
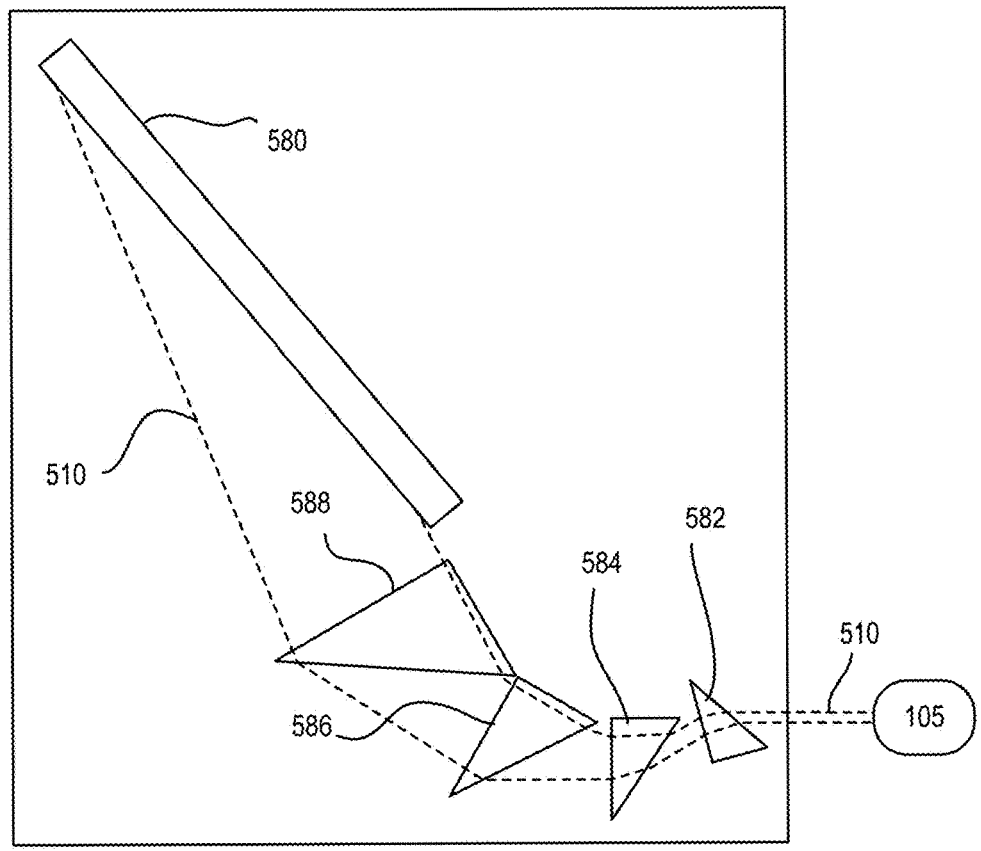
FIG. 5 is a block diagram of an exemplary line narrowing module that can be used in a spectral feature selection system of FIG. 1.

The second actuatable apparatus 135 (which acts as a spectral feature selection system) receives the light beam 510 from the master oscillator 400 of the optical source 105 and finely tunes the spectral output of the light beam 110 produced by the optical source 105 by finely tuning the spectral features of the light beam 510 based on the input from the control system 140. Referring also to FIG. 5, an exemplary second actuatable apparatus 135 is shown that couples to light from the optical source 105. In some implementations, the second actuatable apparatus 135 receives the light beam 510 from the master oscillator 400 to enable the fine tuning of the spectral features such as wavelength and bandwidth within the master oscillator 400 to adjust these spectral features of the seed light beam 405.

In the implementation of FIG. 5, the second actuatable apparatus 135 includes one or more optical features of an optical system. The optical system, in this example, includes the following optical features: a reflective grating 580 and refractive optical elements such as prisms 582, 584, 586, 588, one or more of which can be rotatable. At least one of the optical features (for example, the prism 582) is configured to adjust particular characteristics of the generated light beam 110 to thereby adjust the spectral feature of the light beam 110 by adjusting the optical features of the light beam 510 within the master oscillator 400. Each optical feature is optically coupled to the light beam 110 produced by the optical source 105 by being coupled to the light beam 510 of the master oscillator 400.

The second actuation module 125 can be a mechanical device for moving or controlling the optical feature (such as the prism 582) of the optical system to change the spectral feature of the light beam 510 (which changes the spectral feature of the seed light beam 405, which changes the spectral feature of the light beam 110 output from the optical source 105). The second actuation module 125 receives a signal from the control system 140, and converts that signal into some kind of motion imparted to the optical feature (for example, the prism 582) of the optical system. For example, the second actuation module 125 can include one or more force devices (to apply forces to regions of the optical features such as the grating) and rotation stages for rotating one or more of the prisms (such as the prism 582). The second actuation module 125 can include, for example, motors such as stepper motors, valves, pressure-controlled devices, piezoelectric devices, linear motors, hydraulic actuators, voice coils, etc. In this example, the second actuatable apparatus 135 is the prism 582, and rotation of the prism 582 adjusts an optical magnification of the light beam 510 that impinges on the grating 580, and this in turn causes a change in the bandwidth of the light beam 510.

In the example of FIG. 4, the first actuatable apparatus 130 is a timing module that is connected to the first stage (the master oscillator 400) and to the second stage (the power amplifier 410) to control a relative timing between a first trigger signal sent to the master oscillator 400 and a second trigger signal sent to the power amplifier 410. Exemplary timing modules are shown and described in U.S. Pat. Nos. 7,830,934 and 7,203,216, both of which are incorporated herein by reference in their entirety. By adjusting the relative timing between the two trigger signals, the spectral feature (such as the bandwidth) of the light beam 110 can be controlled. In particular, the seed light beam 405 from the master oscillator 400 should pass through the discharge region of the power amplifier 410 during a time when the population is inverted in the laser gas within the power amplifier 410 so that the amplification of the seed light beam 405 can occur within the power amplifier 410. Thus, it may be that by delaying the pulse of the seed light beam 405, the bandwidth of the light beam 110 output from the power amplifier 410 is reduced, depending on which the population is inverted in the laser gas of the power amplifier 410. In general the longer that a pulse of the seed light beam 405 remains in the master oscillator 400, the narrower will be the bandwidth of the light beam 110 output by the power amplifier 410. Hence, relative timing actuation between the trigger signal to the master oscillator 400 and the trigger signal to the power amplifier 410 can be used to control the bandwidth of the light beam 110.

Since relative timing between these trigger signals can be changed on every laser light pulse, such control provides a more fine-tuned and more rapid method of controlling the spectral feature than is provided with the second actuation module 125, which is constrained by how fast the optical feature on the path of the light beam 510 can be physically moved.

Together, such coordination and cooperation between the two actuatable apparatus 130, 135 can be employed by the control system 140 to hold or maintain one or more spectral features (such as the wavelength or bandwidth) at a desired setpoint or at least within a desired range around a setpoint, even though the optical source 105 may be subjected to a wide array of disturbances 107.

Figure 6:
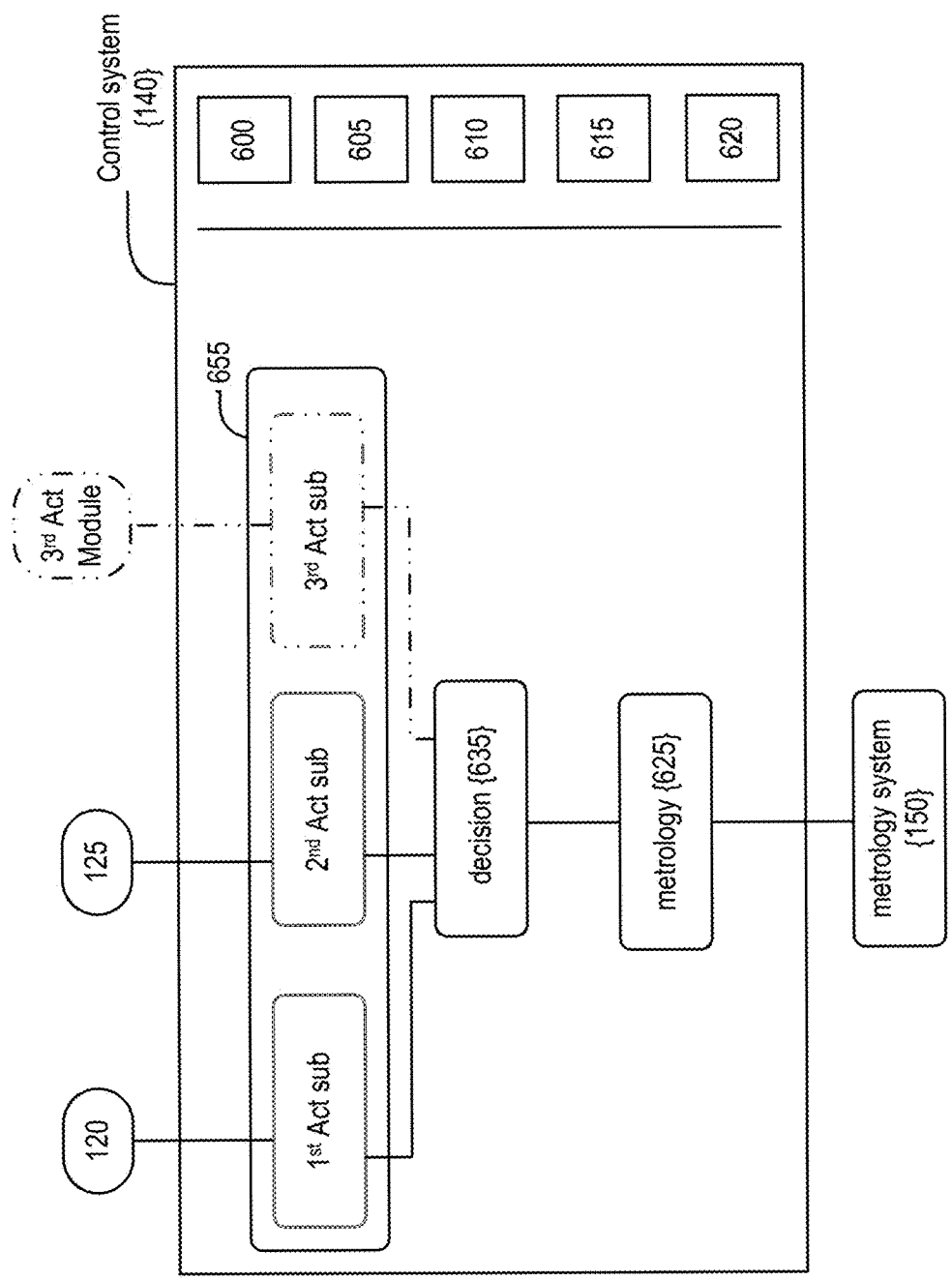
FIG. 6 is a block diagram of an exemplary control system of the optical system of FIG. 1.

Referring to FIG. 6, details about the control system 140 are provided that relate to the aspects of the system and method described herein. The control system 140 can include other features not shown in FIG. 6. In general, the control system 140 includes one or more of digital electronic circuitry, computer hardware, firmware, and software.

The control system 140 includes memory 600, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control system 140 can also include one or more input devices 605 (such as a keyboard, touch screen, microphone, mouse, hand-held input device, etc.) and one or more output devices 610 (such as a speaker or a monitor).

The control system 140 includes one or more programmable processors 615, and one or more computer program products 620 tangibly embodied in a machine-readable storage device for execution by a programmable processor (such as the processors 615). The one or more programmable processors 615 can each execute a program of instructions to perform desired functions by operating on input data and generating appropriate output. Generally, the processor 615 receives instructions and data from memory 600. Any of the foregoing may be supplemented by, or incorporated in, specially designed ASICs (application-specific integrated circuits).

The control system 140 includes, for example, a metrology processing system 625, a decision processing system 635, and an actuation processing system 655 (which can include sub-systems for interfacing with each of the actuation modules 120, 125). Each of these processing systems can be a set of computer program products executed by one or more processors such as the processors 615.

The metrology processing system 625 receives the output from each of the observation system 305, the spectral feature unit 310, and other measurement units 315 of the metrology system 150. The decision processing system 635 receives the outputs from the metrology processing system 625 and determines which actuation sub-system needs to be activated.

While only a few processing systems are shown in FIG. 6, it is possible for the control system 140 to include other processing systems. Additionally, although the control system 140 is represented as a box in which all of the components appear to be co-located, it is possible for the control system 140 to be made up of components that are physically remote from each other.

In general, the control system 140 receives at least some information about the light beam 110 from the metrology system 150, and the metrology processing system 625 performs an analysis or analyses on the information to determine how to adjust one or more spectral features (for example, the bandwidth) of the light beam 110 supplied to the output apparatus 145. Based on this determination, the control system 140 sends signals to the actuation processing system 655 to control operation of the optical source 105.

The first and second actuation modules 120, 125 include electronics in the form of any combination of firmware and software.

Referring to FIG. 7, the lithography exposure apparatus 145 includes an optical arrangement that includes an illuminator system having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer. The illuminator system adjusts the range of angles for the light beam 110 impinging on the mask. The illuminator system also homogenizes (makes uniform) the intensity distribution of the light beam 110 across the mask. The lithography exposure apparatus 145 can include, among other features, a lithography controller, air conditioning devices, and power supplies for the various electrical components. The lithography controller controls how layers are printed on the wafer.

The wafer is irradiated by the light beam 110. A process program or recipe determines the length of the exposure on the wafer, the mask used, as well as other factors that affect the exposure. During lithography, a plurality of pulses of the light beam 110 illuminates the same area of the wafer to form an illumination dose. The number of pulses N of the light beam 110 that illuminate the same area can be referred to as an exposure window or slit and the size of this slit can be controlled by an exposure slit placed before the mask. In some implementations, the value of N is in the tens, for example, from 10-100 pulses. In other implementations, the value of N is greater than 100 pulses, for example, from 100-500 pulses. One or more of the mask, the objective arrangement, and the wafer can be moved relative to each other during the exposure to scan the exposure window across an exposure field. The exposure field is the area of the wafer that is exposed in one scan of the exposure slit or window.

Figure 9:
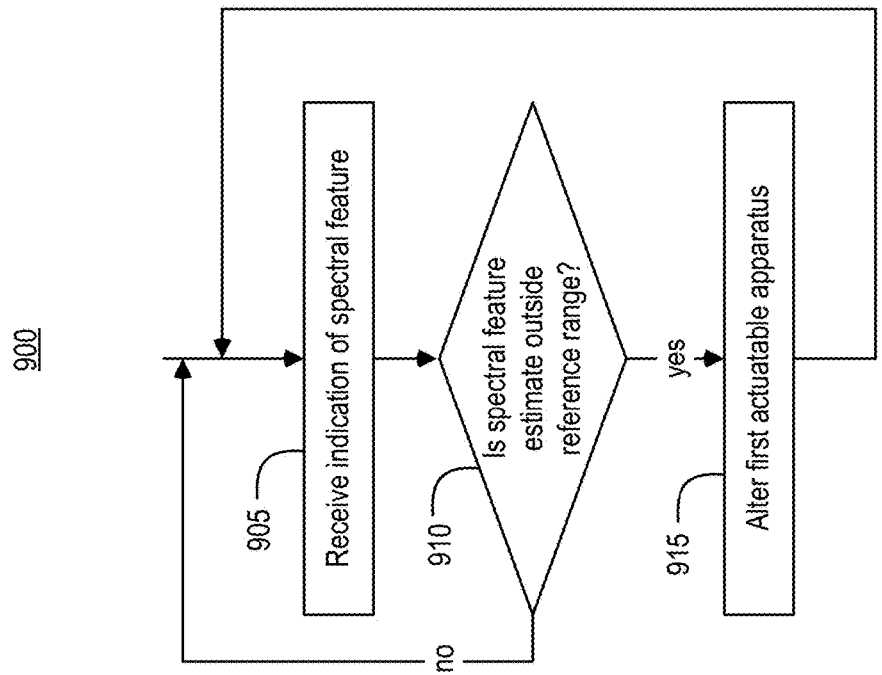
FIG. 9 is a flow chart of an exemplary closed-loop control procedure performed by the first actuatable apparatus of the actuation system of FIG. 1.
Figure 8:
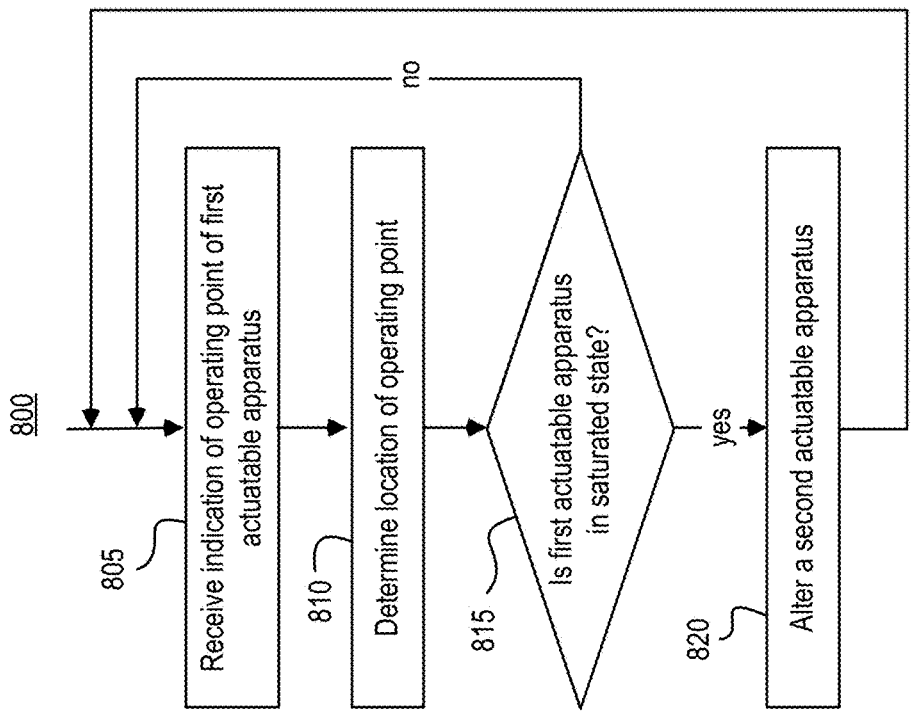
FIG. 8 is a flow chart of an exemplary procedure for desaturating a first actuatable apparatus of the actuation system of FIG. 1.

Referring to FIGS. 8 and 9, a process control procedure 800 (FIG. 8) is performed by the optical system 100 to desaturate the first actuatable apparatus 130 while the spectral feature (in this example, the bandwidth) is under a closed-loop control procedure 900 (FIG. 9) using the first actuatable apparatus 130. Reference is made to the process control diagram of FIG. 10 while describing the procedures 800, 900.

During operation of the optical system 100, the closed-loop control procedure 900 is performed to generally control the bandwidth of the pulsed light beam 110 output from the optical source 105. The procedure 900 includes receiving an estimation of the bandwidth of the pulsed light beam 110 produced by the optical source 105 (905) and determining whether the estimated bandwidth is outside a range of reference values of the spectral feature (910). If the bandwidth estimation is outside the range of reference values of the spectral feature (910), then the first actuatable apparatus 130 is altered to adjust the bandwidth of the pulsed light beam 110 (915). The range of reference values of the bandwidth can be an actual range of a plurality of reference values or it can be a single reference value.

As discussed above, during the closed-loop control procedure 900 (that is, during normal usage), it is possible that the first actuatable apparatus 130 becomes saturated or suffers a limited range. This means that the first actuatable apparatus 130 is not able to adjust the bandwidth of the light beam 110 even though it is being altered under control of the first actuation module 120. Because of this, the disturbances 107 will not be fully or adequately corrected and the bandwidth of the light beam 110 at the output apparatus 145 will not be adequately corrected or adjusted.

In order to maintain the first actuatable apparatus 130 in its full range, which means that the first actuatable apparatus 130 can modify the bandwidth of the light beam 110 within a desired range of bandwidths, the procedure 800 is performed. The procedure 800 uses the second actuatable apparatus 135, which is in series with the first actuatable apparatus 130 so that adjustment of the bandwidth using the second actuatable apparatus 135 has an effect on the range at which the first actuatable apparatus 130 can be adjusted.

The optical system 100 receives an indication of an operating point of the first actuatable apparatus 130 (805). For example, the control system 140 can receive the indication of the operating point of the first actuatable apparatus 130 from the observation system 305 of the metrology system 150. In some implementations, the control system 140 can compute or determine the indication of the operating point based on data received from the metrology system 150. The operating point of the first actuatable apparatus 130 characterizes where, within a range of possible settings, values, or conditions, the first actuatable apparatus 130 is presently operating. The optical system 100 determines the location of the operating point of the first actuatable apparatus 130 based on the received indication of the operating point of the first actuatable apparatus 130 (810).

Figure 11:
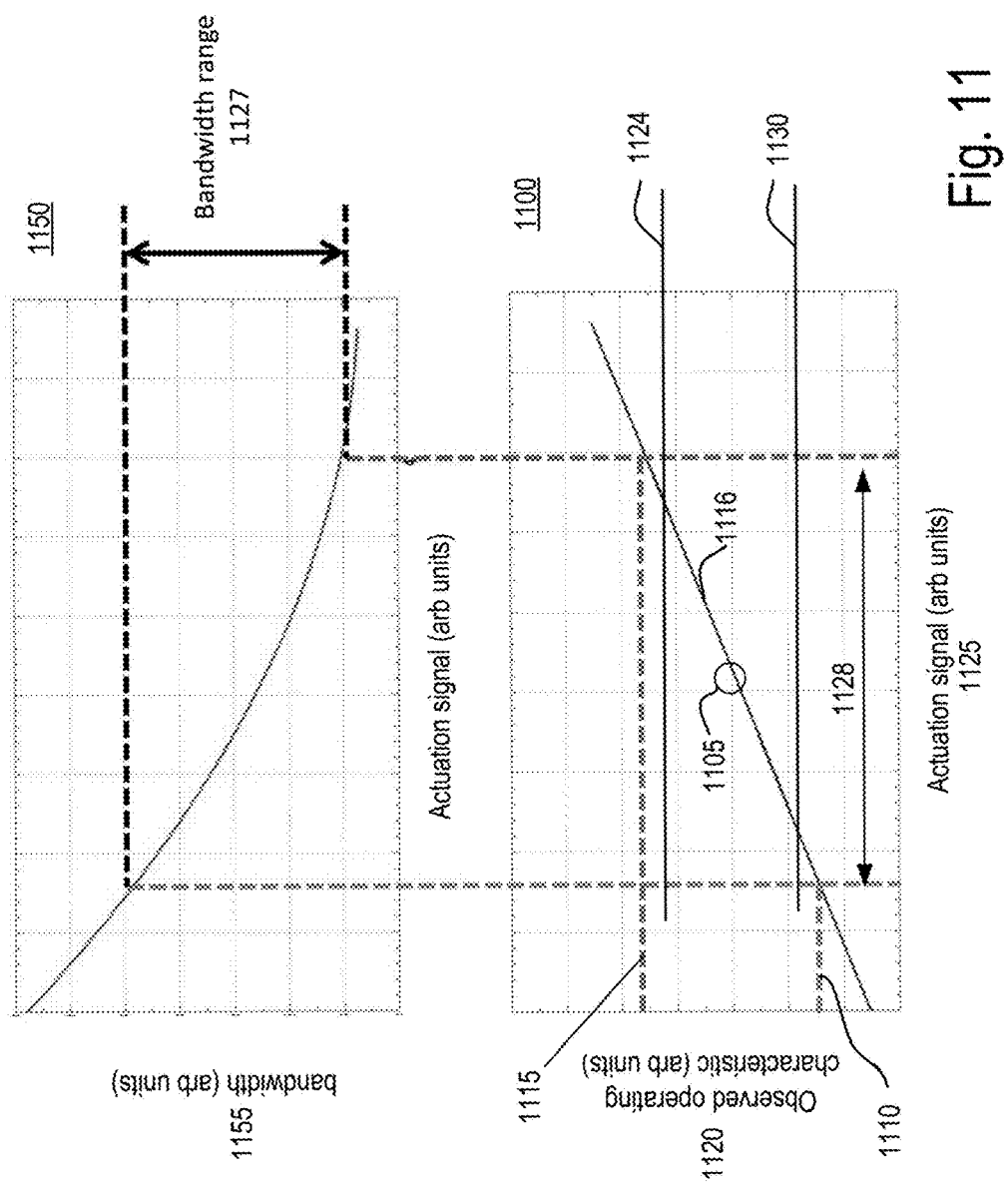
FIG. 11 are exemplary graphs that characterize the behavior of an actuatable apparatus of the system of FIG. 1.

Referring also to FIG. 11, exemplary graphs 1100 and 1150 that characterize the first actuatable apparatus 130 are shown. Graph 1100 shows a relationship between an observed characteristic 1120 of the optical system 100 (as provided by the observation system 305) that indicates how the first actuatable apparatus 130 is operating (vertical axis) relative to the actuation signal 1125 (horizontal axis) provided to the first actuation module 120 to control the first actuatable apparatus 130 and therefore control the bandwidth of the light beam 110.

Graph 1100 also shows an operating point 1105 of the first actuatable apparatus 130. The operating point 1105 is the operating point of the first alterable apparatus 130 at a particular instance of time. The operating point 1105 can thus be considered to be the actual, determined, or measured operating point of the first actuatable apparatus 130. The operating point 1105 is alterable (can be changed or adjusted) between a lower limit 1110 and an upper limit 1115 along a characteristic curve 1116 that relates the observed characteristic 1120 of the apparatus 130 to the actuation signal 1125 provided to the module 120. The lower limit 1110 and the upper limit 1115 can be the full operational range of the first actuatable apparatus 130, or the lower limit 1110 and/or the upper limit 1115 can be limits that are within the full operational range of the apparatus 130, as discussed more fully below and with respect to FIG. 12.

In the example shown in Graph 1100, the characteristic curve 1116 is linear between the upper limit 1115 and the lower limit 1110. That is, there is a linear relationship between the observed characteristic 1120 and the actuation signal 1125 between the upper limit 1115 and the lower limit 1110. However, in other examples, the characteristic curve 1116 can be more complex than the linear shape. In the example of FIG. 11, the actuation signal 1125 is a differential timing signal (which was discussed above). The observed characteristic 1120 is discussed in more detail below.

Graph 1150 of FIG. 11 shows how the spectral feature (bandwidth 1155 in the example of FIG. 11) changes relative to the actuation signal 1125 (horizontal axis) provided to the first actuation module 120 to control the first actuatable apparatus 130 during the procedure 900. In the example shown, the spectral feature (bandwidth 1155) varies within a bandwidth range 1127 that corresponds to a range of values 1128 of the actuation signal 1125. By adjusting the operating point 1105 of the first actuatable apparatus 130 along the characteristic curve 1116, the spectral feature (the bandwidth in the example of FIG. 11) of the pulsed light beam 110 is adjusted.

When the first actuatable apparatus 130 is saturated, the first actuatable apparatus 130 is not able to adjust the bandwidth of the light beam 110. When the first actuatable apparatus 130 is in the saturated state, the apparatus 130 may be unable to adjust the bandwidth (that is, the apparatus 130 can be saturated) or the apparatus 130 may be able to cause only limited adjustments to the bandwidth of the light beam 110 (that is, the apparatus 130 is approaching saturation). When the first actuatable apparatus 130 is determined to be in a saturated state, the procedure 800 desaturates or changes the first actuatable apparatus 130 into an unsaturated state so that it is able to continue to adjust the spectral feature of the light beam 110. When in the unsaturated state, the first actuatable apparatus 130 can adjust the bandwidth to any value within the bandwidth range 1127. Additionally, the procedure 800 can desaturate the first actuatable apparatus 130 while the optical source 105 is in operation and without having to stop the optical source 105 or disassemble any part of the optical source 105.

The optical system 100 determines whether the first actuatable apparatus 130 is in the saturated state based on the determined location at 810 (815). If the first actuatable apparatus 130 is in the saturated state (815), then the optical system 100 alters the second and distinct actuatable apparatus 135 to change the first actuatable apparatus 130 to the unsaturated state and to adjust the spectral feature of the pulsed light beam 110 (820).

As discussed above, when in the saturated state, the first actuatable apparatus 130 cannot make or can make only limited adjustments to the bandwidth. The first actuatable apparatus 130 can be determined to be in the saturated state, for example, when the operating point 1105 is at or above the upper limit 1115 or at or below the lower limit 1110. In this example, the first actuatable apparatus 130 can be changed to the unsaturated state by altering the second actuatable component 135 so that the operating point 1105 lies between the upper limit 1115 and the lower limit 1110. The unsaturated state can be any of the possible operating points between the upper limit 1115 and the lower limit 1110, and can include all or fewer than all of the possible operating points between the upper limit 1115 and the lower limit 1110.

Figure 12:
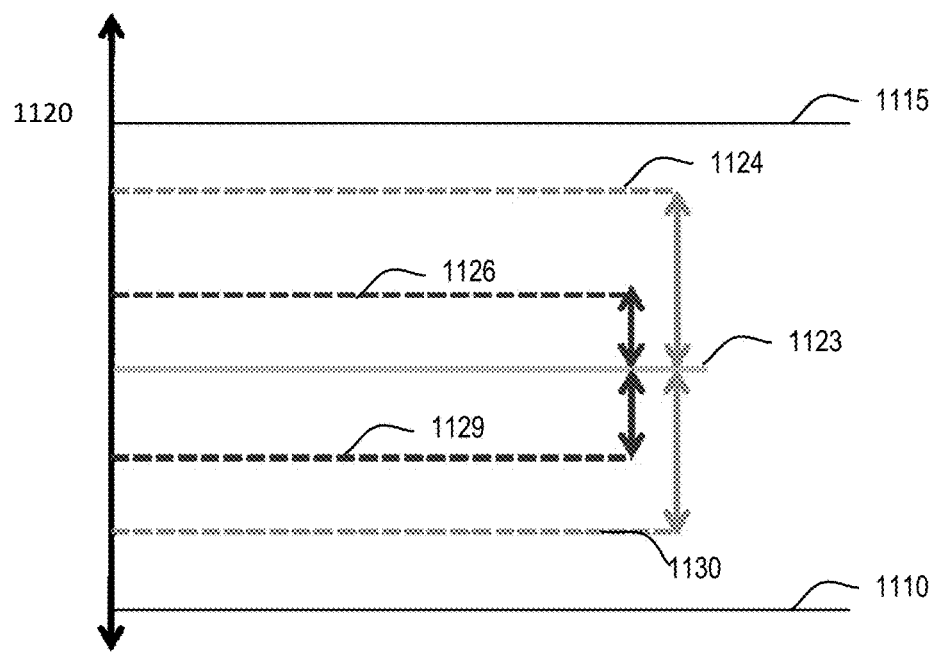
FIG. 12 is an exemplary control chart for determining whether the actuatable apparatus is in a saturated state.

In an exemplary implementation, and with reference to FIG. 8, FIG. 11, and FIG. 12, at (810), the control system 140 (for example, the metrology processing system 625) can determine the location of the operating point 1105 relative to one or more of an upper activation limit 1124 and a lower activation limit 1130. The upper and lower activation limits 1124, 1130 are also shown in FIG. 12, which is a control chart that includes exemplary limits or thresholds that can be used to determine the location of the operating point 1105 and/or whether the first actuatable apparatus 130 is in the saturated state. The exemplary limits and thresholds include a variety of limits and thresholds that are between the upper limit 1115 and the lower limit 1110 because the first actuatable apparatus 130 can be considered to be in the saturated state even when the first actuatable apparatus 130 is not truly saturated and can still make adjustments to the spectral feature. Including limits and thresholds that are within the upper limit 1115 and the lower limit 1110 may ensure that the first actuatable apparatus 130 is adjusted prior to reaching saturation and thus never becomes saturated.

In the example shown in FIG. 12, the upper activation limit 1124 and the lower activation limit 1130 are between the upper limit 1115 and the lower limit 1110. The control system 140 (for example, the metrology processing system 625) determines whether the first actuatable apparatus 130 is in a saturated state (815) based on the whether the operating point 1105 is between the upper activation limit 1124 and the lower activation limit 1130. The first actuatable apparatus 130 is considered to be in the saturated state if the operating point 1105 is at or above the upper activation limit 1125 or at or below the lower activation limit 1130. The first actuatable apparatus 130 is considered to be in an unsaturated state if its operating point 1105 is between the upper activation limit 1124 and the lower activation limit 1130. If the first actuatable apparatus 130 is in the saturated state, the second actuatable apparatus 135 is altered to change the first actuatable apparatus 130 to the unsaturated state.

Because the upper activation limit 1124 and the lower activation limit 1130 are between the upper limit 1115 and the lower limit 1110, the upper and lower activation limits 1124, 1130 can be used to, for example, desaturate the first actuatable apparatus 130 when the apparatus 130 is still capable of performing limited adjustments to the spectral feature but before the actuatable apparatus 130 becomes so saturated that it is unable to adjust the spectral feature at all.

Additionally, in some implementations, when the first actuatable apparatus 130 is determined to be in the saturated state, the second actuatable apparatus 135 can be altered until the operating point 1105 of the first actuatable apparatus 130 is between an upper deactivation limit 1126 and a lower deactivation limit 1129. The upper deactivation limit 1126 and the lower deactivation limit 1129 are between the upper activation limit 1124 and the lower activation limit 1130 (which are between the upper limit 1115 and the lower limit 1110). Because the upper activation limit 1124 and the lower activation limit 1130 are used in this example to define the saturated state (that is, when the operating point 1105 is above the upper activation limit 1124 or below the lower activation limit 1130, the apparatus 130 is determined to be in the saturated state), the lower deactivation limit 1129 and the upper deactivation limit 1126 define a range that is completely within the range of operating points that correspond to the unsaturated state. Thus, by altering the second actuatable apparatus 135 until the operating point 1105 is between the lower deactivation limit 1126 and the upper deactivation limit 1129, the first actuatable apparatus 130 is changed to be well within the unsaturated state and may be more likely to remain in the unsaturated state.

The first actuatable apparatus 130 can be associated with a target operating point 1123. The target operating point 1123 can be an operating point at which the first actuatable apparatus 130 is known to perform optimally. For example, the target operating point 1123 can be the operating point that corresponds to an actuation signal that, when provided to the first actuatable apparatus 130 causes the optical source 105 and/or the components of the optical source 105 to perform in a manner that causes the light beam 110 to have maximum power under the current operating conditions of the optical source 105. The target operating point 1123 can be anywhere between the upper limit 1115 and the lower limit 1110. For example, the target operating point 1123 can be the center point of a range of values defined by the upper limit 1115 and the lower limit 1110.

In implementations that include the upper activation limit 1124 and the lower activation limit 1130, the limits 1124 and 1130 can be centered about the target operating point 1123 with the upper activation limit 1124 and the lower activation limit 1130 being equidistant from the target operating point 1123. However, the target operating point 1123 can be at any location between the upper activation limit 1124 and the lower activation limit 1130.

In implementations that employ the upper deactivation limit 1126 and the lower deactivation limit 1129, the target operating point 1123 can be equidistant from the upper deactivation limit 1126 and the lower deactivation limit 1129, or the target operating point 1123 can be closer to one of the limits 1126, 1129 than the other.

The upper activation limit 1124 and the lower activation limit 1130, and/or the upper deactivation limit 1126 and the lower deactivation limit 1129 can be set based on or determined relative to the target operating point 1123. That is, in some implementations, these limits can be set or determined to be a particular distance from the target operating point 1123 so that altering the second actuatable apparatus 135 to change the first actuatable component 130 to be in an unsaturated state has the effect of moving the operating point 1105 of the first actuatable apparatus 130 closer to the target operating point 1123. In some implementations, the operating point 1105 of the first actuatable component 130 is moved until it is equal to the target operating point 1123.

Moreover, in some examples, the determination of whether the first actuatable component 130 is in the saturated state is performed using the target operating point 1123. For example, the operating point 1105 of the first actuatable apparatus 130 and the target operating point 1123 can be compared to each other to determine how close the operating point 1105 is to the target operating point 1123 by subtracting a numerical value that represents the target operating point 1123 from a numerical value that represents the operating point. The magnitude of that difference can be compared to a pre-determined threshold. If the magnitude of the difference exceeds the threshold, the first actuatable apparatus 130 is determined to be in the saturated state and the second actuatable apparatus 135 is altered, which results in the operating point 1105 of the first actuatable apparatus 130 moving closer to the target operating point 1123 and the first actuatable apparatus changing to the unsaturated state.

The target operating point 1123 can be a value that is calibrated, determined experimentally through testing of the first actuatable apparatus 130, or determined from past uses of the first actuatable apparatus. Additionally, the target operating point 1123 can depend on physical characteristics of the light source 105 that remain constant during operation of the optical source 105 (such as the geometry of the master oscillator 400 or the geometry of the power amplifier 410) and/or on the operating conditions of the optical source 105, which can change during operation of the optical source 105. Thus, the target operating point 1123 may change during operation of the light source 105. In these examples, the target operating point 1123 can be adjusted or changed by an operator of the optical source 105 or the target operating point 1123 can be adjusted or changed by an automated process. Further, in implementations in which the activation limits 1124, 1130 and/or deactivation limits 1126, 1129 are based on the target operating point 1123, these limits can also change during operation of the optical source 105.

Thus, the procedure 800 allows the operating point 1105 of the first actuatable apparatus 130 to be changed, adjusted, and/or controlled during operation of the optical source 105 to prevent or reduce the occurrence of a condition in which the first actuatable apparatus 130 is unable to adjust the spectral feature.

Figure 10:
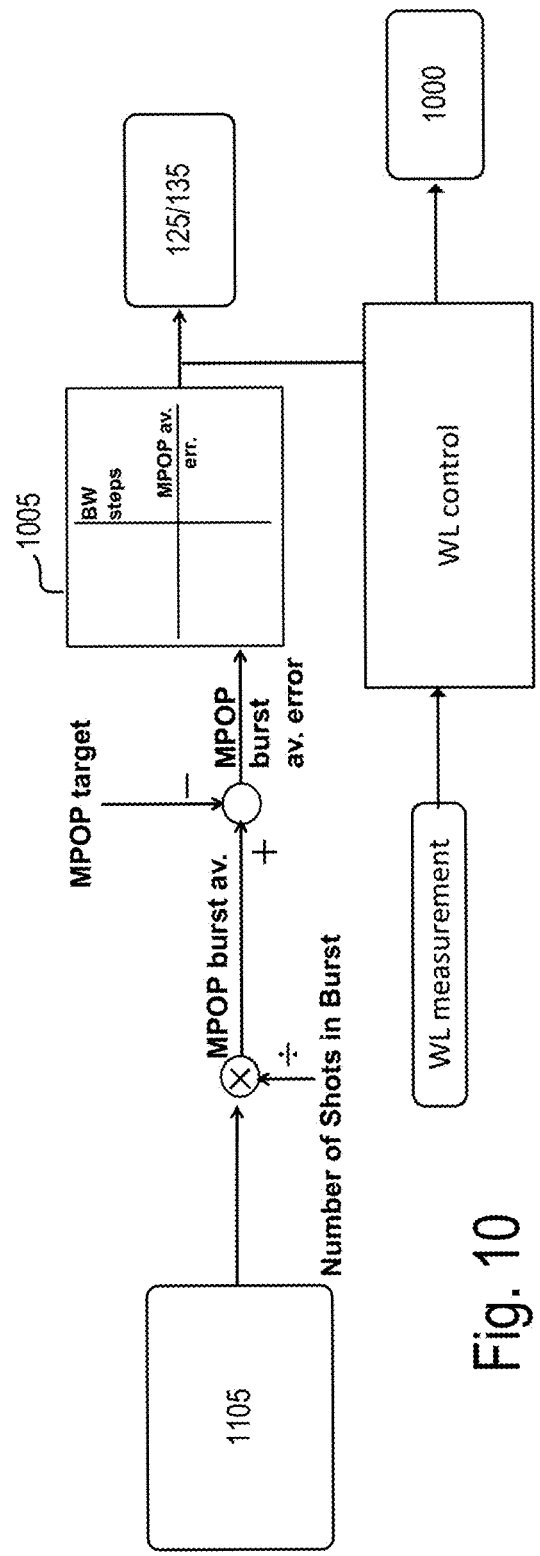
FIG. 10 is a block diagram of an exemplary process control system that supplements the procedure of FIG. 8.

As discussed above, when the first actuatable apparatus 130 is determined to be in the saturated state, the second actuatable apparatus 135 is altered to change the first actuatable apparatus 130 to the unsaturated state. Altering the second actuatable apparatus 135 can include causing the second actuation component 130 to move an optical feature, such as the prism 582 of FIG. 5, which interacts with the light beam 110. Moving the prism 582 causes the spectral bandwidth of the light beam 110 to change. However, moving the prism 582 can also cause a different spectral feature, such as the wavelength of the light beam to change. To compensate for this wavelength change, a third actuatable apparatus 1000 (which is shown in FIG. 10) that is distinct from both the first and second actuatable apparatus 130, 135 can be altered to adjust the wavelength of the light beam 110. In this manner, the third actuatable apparatus 1000 can be controlled to compensate for changes in other spectral features (such as wavelength) that may occur when the second actuatable apparatus 135 is altered to desaturate the first actuatable apparatus 130.

The procedure 800 can be performed while the optical source 105 is operating and producing the light beam 110. As noted above, altering the second actuatable apparatus 135 to desaturate the first actuatable apparatus 130 can cause other spectral features of the light beam 110 to change. To minimize the impact of altering the second actuatable apparatus 135 on the spectral features of the light beam while still performing the procedure 800 while the optical source 105 is in operation, in some implementations, the second actuatable apparatus 135 is altered only when it is not interacting with the light beam 110. For example, the light beam 110 can be a pulsed light beam, and the second actuatable apparatus 135 can be restricted such that the second actuatable apparatus 135 is altered only between pulses of the light beam 110. In another example, the light beam 110 can be a pulsed light beam that includes bursts of many (for example, hundreds) of pulses of light separated by temporal periods of no light. In these examples, the second actuatable apparatus 135 is only altered during the period of no light between the bursts. In some examples in which the light beam 110 is a pulsed light beam that includes bursts of pulses of light, the second actuatable apparatus 135 is only altered during the period of no light that occurs between bursts or between the pulses within a burst.

Regardless, the second actuatable apparatus 130 is altered while the optical source 105 is in operation and producing the light beam 110. Thus, although alteration of the second actuatable apparatus 135 for the purpose of changing the first actuatable apparatus 130 to the unsaturated state is, in some implementations, restricted to time periods in which light is not interacting with the first actuatable apparatus 130, these time periods are time periods that are incidental to the type of light beam that is produced while the optical source 105 is in operation, not time periods that arise by removing the light source 105 from operation.

With reference to FIG. 10, in an exemplary implementation, the control system 140 (for example, the metrology processing system 625) can determine the location of the operating state or point 1105 (810) and can determine whether the first actuatable apparatus 130 is in a saturated state (815) by comparing an average or mean value of the operating point 1105 during a previous burst (labeled as MPOP burst av. in FIG. 10) to a target operating point (labeled as MPOP target in FIG. 10) to determine an error in the operating point for that burst (labeled as MPOP burst av. error in FIG. 10). The control system 140 (for example, the decision processing system 635) can look at a pre-determined relationship (box 1005) between the average error in the operating point and an actuation signal and use that relationship to determine the signal to send to the second actuation module 125 at 820.

Alternatively, it is possible for the control system 140 to compare a single value of the operating point 1105 to a target operating point to determine the error in the operating point.

Figure 13:
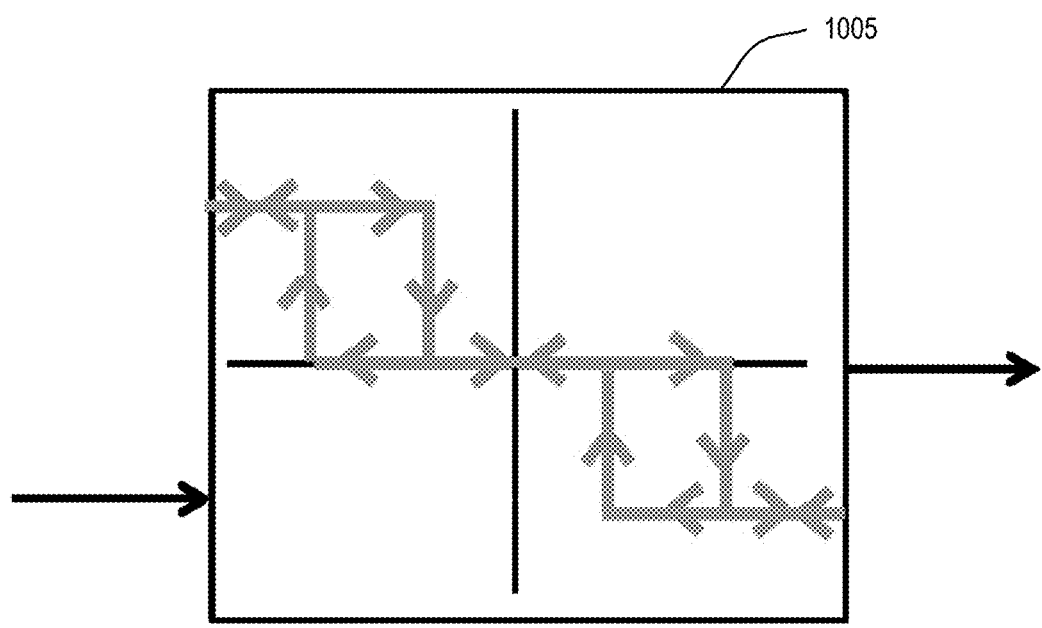
FIG. 13 is a graph showing a relationship for use in the process control system of FIG. 10.

An exemplary relationship 1005 is shown in FIG. 13 in which the average error in the operating point is shown along the horizontal axis and the actuation signal is shown in the vertical axis. In this example, there is a central deadband (or neutral) region in which the average error changes but the actuation signal is not alterable; this region is present to prevent oscillation or repeated activation-deactivation cycles of the second actuation module 125. Additionally, there is are two hysteretic regions that flank the deadband region; in these regions, the value of the actuation signal output to the second actuation module 125 is determined based on the prior value of the average error in the operating point.

In other implementations, the second actuatable apparatus 135 is an optical feature other than the prism 582. For example, the second actuatable apparatus 135 could be the grating 580 and the second actuation module 125 could cause the grating 580 to change its shape to thereby change the spectral feature of the light beam 510. As another example, the second actuatable apparatus 135 could be one or more adjustable apertures placed in the path of any of the light beams 510, 405, 110. As another example, the second actuatable apparatus 135 can be an optical device such as the grating 580 or one of the prisms 582, 584, 586, 588 (or another optical element placed in the path of the light beam 510, 405, or 110) and the second actuation module 125 could cause the such optical element to change its direction rapidly to dither or oscillate the central wavelength of the light beam 110 to thereby change the instantaneous bandwidth so that the bandwidth appears to be broader or narrower than the instantaneous bandwidth at the output apparatus 145.

Other implementations are within the scope of the following claims.

What is claimed is:

1. A system for controlling a spectral feature of a pulsed light beam produced by an optical source, the system comprising:
    a first actuation module coupled to a first actuatable apparatus of the optical source, the first actuatable apparatus being altered within a range of values about a target value by the first actuation module to thereby alter the spectral feature of the pulsed light beam;
    a second actuation module coupled to a second and distinct actuatable apparatus of the optical source, the second actuatable apparatus being altered by the second actuation module to thereby alter the spectral feature of the pulsed light beam;
    a metrology system including an observation system connected to at least the first actuation module and configured to output a metric that indicates a deviation between the actual value at which the first actuatable apparatus is operating and the target value;
    a control system connected to the first actuation module, the second actuation module, and the metrology system, and configured to:
        determine whether the deviation is greater than an acceptable deviation, and
        if the deviation is outside the acceptable deviation, then send a signal to the second actuation module to adjust the spectral feature of the pulsed light beam to thereby adjust the actual value at which the first actuatable apparatus is operating to be closer to the target value.

2. The system of claim 1, wherein the optical source comprises a gas discharge system having at least one chamber that houses a gain medium that produces a pulsed light beam when pumped with current pulses in an electric discharge.

3. The system of claim 1, wherein the metrology system includes a spectral feature unit configured to measure the spectral feature of the pulsed light beam output from the optical source, and the control system is configured to receive the measurement of the spectral feature of the pulsed light beam.

4. The system of claim 3, wherein the control system is configured to send a signal to one or more of the first actuation module and the second actuation module to adjust the spectral feature of the pulsed light beam to a new value based on the received measurement of the spectral feature from the spectral feature unit.

5. The system of claim 1, wherein determining whether the deviation is greater than the acceptable deviation comprises determining whether the deviation is so great that the first actuation module is unable to alter the spectral feature of the pulsed light beam to a new value.

6. The system of claim 1, wherein the optical source is a multi-stage gas discharge system, with the first stage being an oscillator apparatus that outputs a pulsed seed light beam and the second stage being an optical amplification apparatus that receives the pulsed seed light beam and outputs the pulsed light beam, and both stages include a gas discharge sub-system.

7. The system of claim 6, wherein the first actuation module is a timing module that is connected to the first stage and the second stage to control a relative timing between a first trigger signal sent to the first stage and a second trigger signal sent to the second stage.

8. The system of claim 1, wherein the second actuation module is a spectral selection module interacting with the pulsed light beam.

9. The system of claim 8, wherein the spectral selection module includes an optical system that is configured to adjust an optical magnification of the pulsed light beam.

10. The system of claim 9, wherein the optical system is coupled to a first stage of the optical source.

11. The system of claim 9, wherein the spectral feature of the pulsed light beam is a width of the pulsed light beam.

12. The system of claim 1, further comprising a third actuation module coupled to a third actuatable apparatus of the optical source, the third actuatable apparatus being altered by the third actuation module to thereby alter another spectral feature of the pulsed light beam.

13. A method for controlling a spectral feature of a pulsed light beam produced by an optical source, the method comprising:
    sending a signal to an optical source to produce a pulsed light beam;
    sending a signal to a first actuation module coupled to a first actuatable apparatus of the optical source for controlling the spectral feature of the pulsed light beam, wherein the first actuatable apparatus is alterable by the first actuation module within a range of values about a target value;
    sending a signal to a second and distinct actuation module coupled to a second actuatable apparatus of the optical source for controlling the spectral feature of the pulsed light beam;
    receiving a metric that indicates a deviation between an actual value at which a first actuatable apparatus of the optical source is operating and a target value;

determine whether the deviation is greater than an acceptable deviation; and if the deviation is greater than the acceptable deviation, then sending a signal to a second actuation module to adjust the spectral feature of the pulsed light beam to thereby adjust the actual value at which the first actuatable apparatus is operating to be closer to the target value.

14. The method of claim 13, wherein sending the signal to the optical source to produce the pulsed light beam comprises sending a current to electrodes in a chamber that houses a gain medium.

15. The method of claim 13, further comprising receiving a measurement of the spectral feature of the pulsed light beam output from the optical source.

16. The method of claim 15, further comprising sending a signal to one or more of the first actuation module and the second actuation module to adjust the spectral feature of the pulsed light beam to a new value based on the received measurement of the spectral feature.

17. The method of claim 13, wherein determining whether the deviation is greater than the acceptable deviation comprises determining whether the deviation is so great that the first actuation module is unable to alter the spectral feature of the pulsed light beam to a new value.

18. The method of claim 13, wherein the first actuatable apparatus is a relative timing between a first trigger signal sent to a first stage of the optical source and a second trigger signal sent to a second stage of the optical source, and the first actuation module is a timing module that adjusts the relative timing based on the received signal.

19. The method of claim 13, wherein the second actuatable apparatus is a spectral selection module that includes an optical system that is configured to adjust an optical magnification of the pulsed light beam.

20. A system comprising:
an optical source configured to emit a pulsed output light beam, the optical source comprising:
   a first chamber and a second chamber positioned on a beam path, the first chamber providing a pulsed seed light beam to the second chamber, the second chamber configured to receive the pulsed seed light beam and emit the pulsed output light beam, and
   a spectral selection module comprising at least one actuatable optical element positioned on the beam path;
an actuatable apparatus coupled to the first chamber of the optical source and the second chamber of the optical source, the actuatable apparatus having an adjustable operating point and being associated with a target operating point, the actuatable apparatus being in a saturated state when the adjustable operating point is at an upper limit or a lower limit and being in an unsaturated state when the adjustable operating point is between the upper limit and the lower limit; and
a control system coupled to the optical source and the actuatable apparatus, the control system configured to:
   access an indication of a value of the adjustable operating point of the actuatable apparatus,
   compare the accessed indication of the value of the adjustable operating point to the upper limit and the lower limit,
   determine if the actuatable apparatus is in a saturated state based on the comparison, and
   if the actuatable apparatus is in the saturated state, actuate at least one of the at least one optical elements of the spectral selection module to change the actuatable apparatus to the unsaturated state.

\* \* \* \* \*